United States Patent
Lourens et al.

(10) Patent No.: US 6,922,084 B2
(45) Date of Patent: Jul. 26, 2005

(54) ULTRA-LOW POWER PROGRAMMABLE TIMER AND LOW VOLTAGE DETECTION CIRCUITS

(75) Inventors: Ruan Lourens, Chandler, AZ (US); Miguel Moreno, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 10/764,919

(22) Filed: Jan. 26, 2004

(65) Prior Publication Data

US 2004/0246031 A1 Dec. 9, 2004

Related U.S. Application Data

(60) Provisional application No. 60/476,323, filed on Jun. 6, 2003.

(51) Int. Cl.[7] .................. G01R 19/00; H03K 5/153; H01L 35/00
(52) U.S. Cl. ............................ 327/60; 327/512
(58) Field of Search ............... 327/52, 56, 58, 327/60, 62, 72, 77–83, 88–90, 512–513; 374/104; 324/441; 702/99, 130

(56) References Cited

U.S. PATENT DOCUMENTS

| | | | |
|---|---|---|---|
| 5,093,584 A | 3/1992 | Woyke et al. | 327/151 |
| 5,862,170 A | 1/1999 | Britton et al. | 374/183 |
| 6,346,848 B1 | 2/2002 | Shkap | 327/538 |
| 6,483,372 B1 | 11/2002 | Bowers | 327/513 |
| 6,509,783 B2 | 1/2003 | Chowdhury | 327/513 |
| 6,811,309 B1 | 11/2004 | Ravishanker | 374/178 |

*Primary Examiner*—My-Trang Nu Ton
(74) *Attorney, Agent, or Firm*—Baker Botts L.L.P.

(57) ABSTRACT

An Ultra-low power voltage detection circuit is implemented in a digital integrated circuit to device to provide a basic timer, programmable timer and programmable low voltage detection (PLVD) using a single connection of the digital integrated circuit device and a passive component(s) external to the digital integrated circuit device. An internal low current source may be enabled so as to discharge an external timing capacitor connected to the output connection, thus eliminating the need for an external resistor. However, timing accuracy may be improved by adding an external discharging resistor and/or charging resistor. The output connection may be configured as a tri-state output and may be driven high to charge and low to discharge the timing capacitor. A voltage reference may be used in determining a voltage trip point for timing and low voltage detection purposes. Temperature may be determined from either a trip voltage compared to a known voltage determined at a known temperature, or a current value of the current source compared to a known current value determined at a known temperature, times a constant.

36 Claims, 1 Drawing Sheet

ULTRA-LOW POWER PROGRAMMABLE TIMER AND LOW VOLTAGE DETECTION CIRCUITS

RELATED PATENT APPLICATION

This application claims priority to commonly owned U.S. Provisional Patent Application Ser. No. 60/476,323; filed Jun. 6, 2003; entitled "Ultra Low Power Microprocessor Timer and PLVD Circuit," by Ruan Lourens and Miguel Moreno, which is hereby incorporated by reference herein for all purposes.

FIELD OF THE INVENTION

The present invention relates generally to low power battery operated devices, and more particularly to ultra-low power programmable timer and low voltage detection circuits.

BACKGROUND OF THE INVENTION TECHNOLOGY

Low power consumption is absolutely critical in digital electronic applications that use batteries as a power source and in most of these applications current drawn while in a sleep mode dictates the battery life of the application. Thus, it is critical to have a very low current drain while in the sleep mode and a low power way to wake up from the sleep mode in a timed manner. Existing wake-up timers that are based on traditional oscillators consume too much power for most lithium battery applications and may consume several microamperes of current. One solution was to use a resistor capacitor (RC) timer that woke up the digital circuit, e.g., digital processor, on a "wake-up on change" event, however, existing digital input structures consume high crowbar currents with a slowly changing input signal.

For some applications it is desirable to have a variable wake-up period that can be controlled with a digital processor.

In battery operated applications a low power programmable low voltage detection (PLVD) circuit is highly desirable but is often omitted due to price and power considerations.

Low power wake-up timers use passive resistor-capacitor timing circuits having slowly rising voltage levels that go toward $V_{DD}$. The problem with these types of timer circuits is that a leaky capacitor when used in a low power mode (high resistor value) may never wake up the device when the leakage current of the capacitor and the input leakage into the device connection exceeds the drive capability of the resistor. This problem may be aggravated at high temperatures, thus making operation of this type of timer unpredictable.

Therefore, what is needed are ultra-low power programmable timer and low voltage detection circuits that consume very little power and are accurate and reliable over the entire useful temperature range of a device.

SUMMARY OF THE INVENTION

The invention overcomes the above-identified problems as well as other shortcomings and deficiencies of existing technologies by providing an ultra-low power circuit that can be used to implement, in a digital integrated circuit device, a basic timer, programmable timer and programmable low voltage detection (PLVD) using a single connection, e.g., pin, ball, pad, tab, surface mount wing and the like, of the digital integrated circuit device and a passive component(s) external to the digital integrated circuit device. An internal low current source may be enabled so as to discharge an external capacitor coupled to the connection, thus eliminating the need for an external resistor. However, timing accuracy may be improved by adding an external discharge resistor since the internal current source may be more process and temperature dependant than the external discharge resistor. The connection may be configured as a tri-state output and may be driven high to charge the capacitor. An analog voltage level detection circuit and, optionally, the current source may be enabled when the digital integrated circuit device is placed into a sleep mode. During the sleep mode, the external capacitor slowly discharges through the voltage level detection circuit and/or current source (and/or the external resistor), and when a low voltage threshold value is reached, a voltage level comparison circuit in the voltage level detection circuit causes a logic level change that activates ("awakens") the digital integrated circuit device from its sleep mode. The digital integrated circuit device may be a digital processor, e.g., microprocessor, microcontroller, programmable logic array (PLA), programmable gate array (PGA), application specific integrated circuit (ASIC), and the like.

Preferably, only a single output connection and external capacitor are required to realize basic timer, programmable timer and PLVD functions. Thus the invention is well suited for cost sensitive applications. The invention circuit detects an analog signal level relative to some threshold or trigger voltage. This enables implementation of ultra-low power timer and PLVD functions, without the high crowbar currents associated with a digital input signal slowly changing from one supply voltage rail to the other.

Timing accuracy of these functions may be improved by adding a single discharge resistor instead of using the internal current source. For programmable timing, an additional charging resistor may be added for more accurate charging of the capacitor to a certain voltage over a predefined time period. Many lithium battery applications require about one microampere of timed sleep current and even the lowest powered clock oscillator based timer circuits consume at least several microamperes. Preferably, the invention has a maximum current consumption of about 350 nanoamperes or less, thus leaving a couple of hundred nanoamperes of standby current available for the digital device when in the sleep mode.

Temperature may be determined from the relationship between the voltage reference and internal current source. The parameters for the voltage reference and the internal current source are dependent upon temperature and process variations during manufacture of the invention. The process variations may be measured when the invention circuit is first turned on under controlled conditions. Measured values corresponding to temperature variations may be determined and stored in a memory, e.g., electrically erasable programmable read only memory (EEPROM), Flash memory and the like, for later use in determining temperature from the invention. The temperature dependency of the voltage reference is substantially linear, however, the internal current source may have a significant second order term, but if the temperature deviation is relatively small, this second order term may be ignored.

A technical advantage of the invention is ultra-low power operation. Yet another technical advantage is the need for a minimum number of external components. Another technical advantage is low cost. Still another technical advantage is very low current discharge of timing circuit. Still another technical advantage is use of an existing output connection of an integrated circuit package. Yet another advantage is temperature sensing by using the reference voltage and internal current source temperature dependencies.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein.

Figure 1:
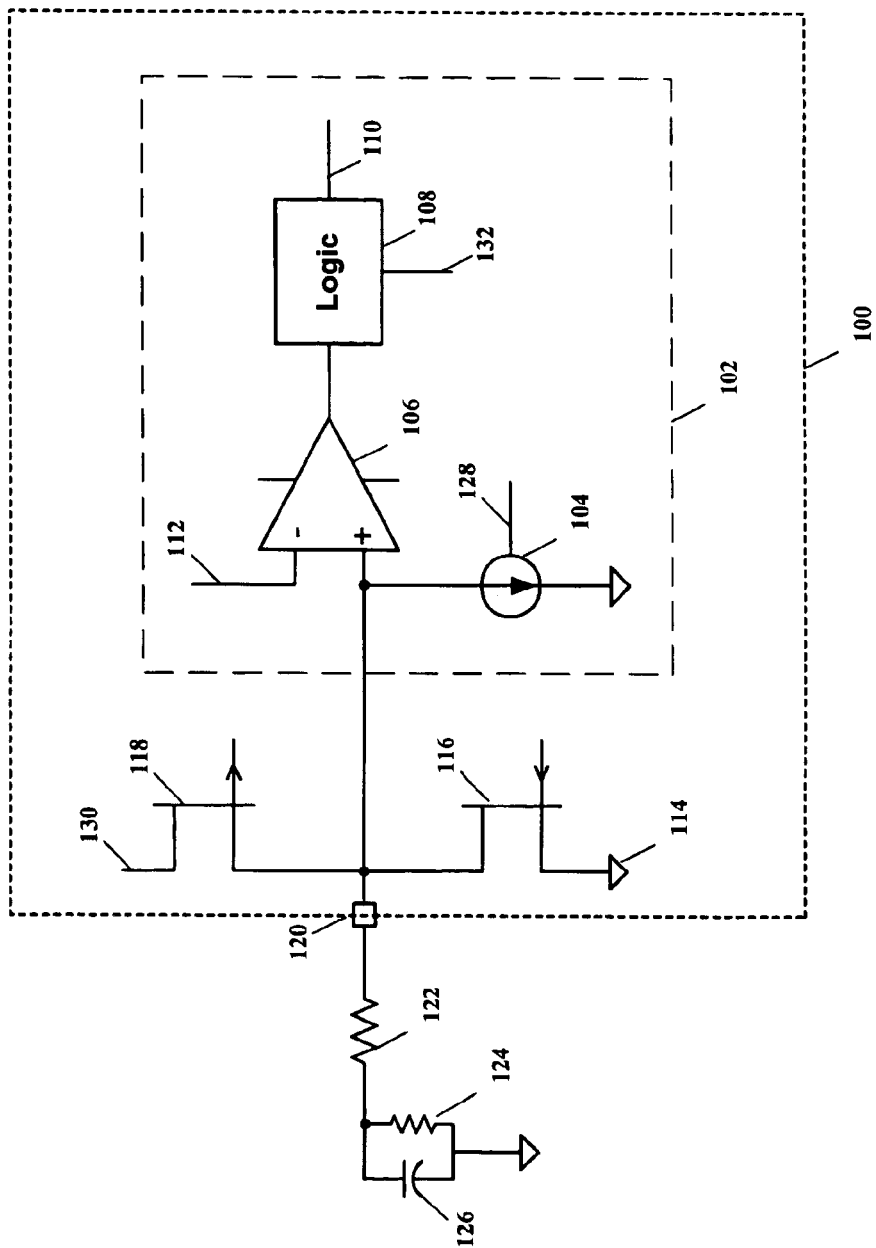
FIG. 1 illustrates a schematic diagram of a circuit for an ultra-low power timer or a programmable low voltage detector (PLVD), according to exemplary embodiments of the present invention.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix.

Referring to FIG. 1, depicted is an ultra-low power timer or a programmable low voltage detector (PLVD), according to exemplary embodiments of the invention. The invention comprises an ultra-low power voltage detection and logic module, generally depicted by the numeral 102, and an external component(s), e.g., timing capacitor 126, resistor 124 and resistor 122. An output connection 120 (e.g., pin, ball, pad, tab, surface mount wing and the like) of a digital integrated circuit device 100, is coupled to a tri-state output circuit comprising transistors 118 and 116. The ultra-low power voltage detection and logic module 102 comprises a very low current internal current source 104 having an enable input 128, an analog comparator 106 (e.g., high gain differential amplifier) having an input connected to the external connection 120 and another input connected to a voltage reference 112, and digital logic 108 having a digital output 110 and an input connected to an output of the comparator 106. The module 102 may be part of the digital integrated circuit device 100. Resistors 122 and 124 are optional and the invention operates satisfactorily without these resistors. The resistors 122 and 124 preferably may enhance functionality of the invention.

The comparator 106 determines whether an analog signal on connection 120 is less than or equal to, or greater than the reference voltage 112. The output of the comparator 106 drives the logic 108 so that its output 110 is at a first digital logic level when the analog signal at connection 120 is less than or equal to the reference voltage 112, and at a second digital logic level when the analog signal is greater than the reference voltage 112.

According to an exemplary embodiment of the invention, a basic timer may be implemented by coupling the capacitor 126 to connection 120. The internal current source 104 remains disabled with by a disable signal to the enable input 128. Connection 120 is defined as a digital output through transistors 116 and 118, and the capacitor 126 is charged to substantially a rail voltage 130, e.g., $V_{DD}$. Once the capacitor 126 is substantially charged to the rail voltage 130, the transistors 116 and 118 are turned off (tri-stated) or otherwise decoupled from the connection 120, the module 102 is enabled through the enable input 132. The capacitor 126 slowing discharges by current being draw from the charge on the capacitor 126 by the enabled module 102, thus the voltage on the capacitor 126 drops in proportion thereto. Once the voltage on the discharging capacitor 126 is less than or equal to the reference voltage 112, the output 110 will change logic levels. The digital integrated circuit device 100 may be placed in a "sleep mode" during this discharge process and then awakened by the logic level change at the output 110. A discharge resistor 124 may be added across the capacitor 126 to ensure a more accurate and controlled discharge rate. Enable inputs 128 and 130 may be coupled together as one input signal.

According to another exemplary embodiment of the invention, a basic timer may be implemented by coupling the capacitor 126 to connection 120, and disabling the internal current source 104 with a disable signal to the enable input 128. Connection 120 may be defined as a digital output through transistors 116 and 118, and the capacitor 126 is charged to substantially rail voltage 130, e.g., $V_{DD}$. Once the capacitor 126 is substantially charged to the rail voltage 130, the transistors 116 and 118 are turned off (tri-stated or decoupled from the connection 120 and the internal current source 104 is enabled through the enable input 128. The capacitor 126 slowing discharges through the internal current source 104 and the voltage on the capacitor 126 drops in proportion thereto. Once the voltage on the discharging capacitor 126 is less than or equal to the reference voltage 112, the output 110 will change logic levels. The digital integrated circuit device 100 may be placed in a "sleep mode" during this discharge process and then awakened by the logic level change at the output 110. Use of the internal current source 104 instead of the resistor 124 may result in a less accurately timed period due to process and temperature variations that may affect the internal current source 104 more than the external resistor 124. Enable inputs 128 and 130 may be coupled together as one input signal.

According to another exemplary embodiment of the invention, a programmable timer may be implemented by presetting the voltage on connection 120 to substantially the voltage rail 114, e.g., $V_{SS}$, with the transistor 116. Since the capacitor 126 is coupled to connection 120, it will be set to substantially the voltage rail 114. Then transistor 118 is turned on to controllably charge the capacitor 126 for a predefined time. During this charging time, the module 102 and/or current source 104 may be disabled to reduce parasitic current draw. A charging time constant may be determined from the series RC time constant combination of resistor 122 and capacitor 126, and the discharge time from the parallel RC time constant combination of resistor 124 and capacitor 126. The value of voltage reference 112 also determines the programmable time constant(s). The charging and discharging time constants may be symmetrical or asymmetrical. Resistor 122 is optional and the invention operates satisfactorily without this resistor. The resistor 122 preferably may enhance functionality of the invention.

A calibration process of this programmable timer may be performed with the digital integrated circuit device 100 is in an active timing mode. Calibration may be determined from a main active clock source (not shown), e.g., internal oscillator or external crystal oscillator. Generally, a constant supply voltage may be assumed, however, in battery applications, the charge and discharge periods may be periodically re-calibrated to ensure sleep timer accuracy.

According to another exemplary embodiment of the invention, a programmable low-voltage detection (PLVD) circuit may be implemented by charging capacitor 126 to the rail voltage 130, then activating the module 102. The capacitor 126 may discharge through the module 102, the activated current source 104, and/or the resistor 124. Discharge timing is such that if a low (battery) voltage is present, the voltage on the capacitor 126 will discharge below the reference voltage 112 within a certain time period and there will be a change in logic level at the output 110. This logic level change may be used to indicate a low battery voltage condition. It is also contemplated and within the scope of the invention that the capacitor 126 may be charged at certain time intervals short enough so as to maintain the voltage on the capacitor above the reference voltage 112.

According to still another embodiment of the invention, measurement of temperature may be determined from the way change in temperature affects the voltage reference and the internal current source. Temperature dependency of the voltage reference is substantially linear, and, if the temperature change is relatively small, the internal current source will also be substantially linear. Generally, values of the voltage reference and the internal current source may be measured at a known temperature. Then the deviation from that known temperature may be approximately determined from either of the following relationships:

$$\Delta T = (V_{IL} - V_{STANDARD})/(-1.25 \times 10^{-3}), \text{ or}$$

$$\Delta T = (I_{SINK} - I_{STANDARD})/(140 \times 10^{-12})$$

where $\Delta T$ is the temperature deviation from a know temperature, $V_{IL}$ the trip voltage, i.e., value of the voltage reference at the temperature deviation; $V_{STANDARD}$ is the value of the voltage reference at the know temperature, $I_{SINK}$ is the value of the internal current source at the temperature deviation, and $I_{STANDARD}$ is the value of the internal current source at the know temperature. $I_{SINK}$ may be determined by how it affects the timing of a precision timer circuit, or determined from the voltage drop measured across a precision resistor in series with the internal current source (i.e., use Ohms law to obtain the current value).

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An integrated circuit device having an ultra-low power timer, comprising:
   a voltage comparison and logic module having an input, an output and a first enable,
   wherein a predetermined current value is drawn at the input when the voltage comparison and logic module is enabled,
   the output is at a first logic level when a voltage on the input is less than or equal to a reference voltage, and
   the output is at a second logic level when the voltage on the input is greater than the reference voltage;
   an external connection of an integrated circuit device, wherein the external connection is coupled to a digital output circuit of the integrated circuit device and to the input of the voltage comparison and logic module; and
   a timing capacitor coupled to the external connection, whereby the digital output circuit of the integrated circuit device charges the timing capacitor and the input of the voltage comparison and logic module discharges the timing capacitor.

2. The integrated circuit device of claim 1, wherein the voltage comparison and logic module comprises:
   a voltage comparator having a first input coupled to the input of the voltage comparison and logic module, and a second input coupled to the reference voltage; and
   a logic circuit coupled to the voltage comparator, the output of the voltage comparison and logic module and the first enable.

3. The integrated circuit device of claim 2, further comprising a low current source having an enable, the low current source is coupled to the first input of the voltage comparison and logic module, wherein the low current source enable activates the low current source to draw current from the external connection.

4. The integrated circuit device of claim 1, wherein the digital output circuit comprises series connected first and second transistors, wherein the first transistor couples a first voltage to the external connection and the second transistor couples a second voltage to the external connection.

5. The integrated circuit device of claim 4, wherein the first transistor charges the timing capacitor to the first voltage.

6. The integrated circuit device of claim 4, wherein the second transistor discharges the timing capacitor to the second voltage.

7. The integrated circuit device of claim 1, further comprising a first external resistor connected in parallel with the timing capacitor.

8. The integrated circuit device of claim 1, further comprising a second external resistor connected in series with the timing capacitor.

9. The integrated circuit device of claim 1, wherein the first logic level causes the integrated circuit device to wake-up when in a sleep mode.

10. An integrated circuit device having an ultra-low power programmable timer, comprising:
    a voltage comparison and logic module having an input, an output and a first enable,
    wherein a predetermined current value is drawn at the input when the voltage comparison and logic module is enabled,
    the output is at a first logic level when a voltage on the input is less than or equal to a reference voltage, and
    the output is at a second logic level when the voltage on the input is greater than the reference voltage;
    an external connection of an integrated circuit device, wherein the external connection is coupled to a digital output circuit of the integrated circuit device and to the input of the voltage comparison and logic module; and
    a timing circuit coupled to the external connection, whereby the digital output circuit of the integrated circuit device discharges the timing circuit and charges the timing circuit to a predetermined voltage value, and the input of the voltage comparison and logic module discharges the timing circuit.

11. The integrated circuit device of claim 10, wherein the voltage comparison and logic module comprises:
   a voltage comparator having a first input coupled to the input of the voltage comparison and logic module, and a second input coupled to the reference voltage; and
   a logic circuit coupled to the voltage comparator, the output of the voltage comparison and logic module and the first enable.

12. The integrated circuit device of claim 11, further comprising a low current source having an enable, the low current source is coupled to the first input of the voltage comparison and logic module, wherein the low current source enable activates the low current source to draw current from the external connection.

13. The integrated circuit device of claim 10, wherein the digital output circuit comprises series connected first and second transistors, wherein the first transistor couples a first voltage to the external connection and the second transistor couples a second voltage to the external connection.

14. The integrated circuit device of claim 13, wherein the second transistor discharges the timing circuit to the second voltage.

15. The integrated circuit device of claim 13, wherein the first transistor charges the timing circuit to the predetermined voltage.

16. The integrated circuit device of claim 10, wherein the timing circuit comprises a timing capacitor and first resistor, wherein the timing capacitor and the first resistor are connected in parallel.

17. The integrated circuit device of claim 16, wherein the timing circuit further comprises a second resistor connected in series with the timing capacitor.

18. The integrated circuit device of claim 10, wherein the first logic level causes the integrated circuit device to wake-up when in a sleep mode.

19. An integrated circuit device having a programmable low-voltage detection (PLVD) circuit, comprising:
   a voltage comparison and logic module having an input, an output and a first enable,
      wherein a predetermined current value is drawn at the input when the voltage comparison and logic module is enabled,
      the output is at a first logic level when a voltage on the input is less than or equal to a reference voltage, and
      the output is at a second logic level when the voltage on the input is greater than the reference voltage;
   an external connection of an integrated circuit device, wherein the external connection is coupled to a digital output circuit of the integrated circuit device and to the input of the voltage comparison and logic module; and
   a timing capacitor coupled to the external connection, whereby the digital output circuit of the integrated circuit device charges the timing capacitor and the input of the voltage comparison and logic module discharges the timing capacitor.

20. The integrated circuit device of claim 19, wherein the voltage comparison and logic module comprises:
   a voltage comparator having a first input coupled to the input of the voltage comparison and logic module, and a second input coupled to the reference voltage; and
   a logic circuit coupled to the voltage comparator, the output of the voltage comparison and logic module and the first enable.

21. The integrated circuit device of claim 20, further comprising a low current source having an second enable, the low current source is coupled to the first input of the voltage comparison and logic module, wherein the second enable activates the low current source to draw current from the external connection.

22. The integrated circuit device of claim 19, wherein the digital output circuit comprises series connected first and second transistors, wherein the first transistor couples a first voltage to the external connection and the second transistor couples a second voltage to the external connection.

23. The integrated circuit device of claim 22, wherein the first transistor charges the timing capacitor to the first voltage.

24. The integrated circuit device of claim 22, wherein the second transistor discharges the timing capacitor to the second voltage.

25. The integrated circuit device of claim 19, further comprising a first external resistor connected in parallel with the timing capacitor.

26. The integrated circuit device of claim 19, wherein the first logic level indicates a low battery voltage condition and the second logic level indicates a desired battery condition.

27. The integrated circuit device of claim 19, wherein the first logic level indicates a low voltage condition.

28. The integrated circuit device of claim 27, wherein if the first logic level occurs within a certain time period there is a low voltage condition.

29. A method of timing with an ultra-low power timer in an integrated circuit device, said method comprising the steps of:
   charging a timing capacitor to a first voltage with an output of an integrated circuit device;
   discharging the timing capacitor with a predetermined current value;
   comparing the discharging timing capacitor voltage with a reference voltage;
   outputting a first logic level when the discharging timing capacitor voltage is greater than the reference voltage, and
   outputting a second logic level when the discharging timing capacitor voltage is less than or equal to the reference voltage.

30. A method of timing with an ultra-low power programmable timer in an integrated circuit device, said method comprising the steps of:
   discharging a timing capacitor to a second voltage with an output of an integrated circuit device;
   charging the timing capacitor to a first voltage with the output of the integrated circuit device within a first time;
   discharging the timing capacitor with a predetermined current value;
   comparing the discharging timing capacitor voltage with a reference voltage;
   outputting a first logic level when the discharging timing capacitor voltage is greater than the reference voltage, and
   outputting a second logic level when the discharging timing capacitor voltage is less than or equal to the reference voltage.

31. A method of detecting low battery voltage with a programmable low voltage detector (PLVD) in an integrated circuit device, said method comprising the steps of:
   charging a timing capacitor to a first voltage with an output of an integrated circuit device at certain time intervals;

discharging the timing capacitor with a predetermined current value;

comparing the discharging timing capacitor voltage with a reference voltage;

outputting a first logic level when the discharging timing capacitor voltage is greater than the reference voltage, and outputting a second logic level when the discharging timing capacitor voltage is less than or equal to the reference voltage.

32. A method of detecting low battery voltage with a programmable low voltage detector (PLVD) in an integrated circuit device, said method comprising the steps of:

charging a timing capacitor to a first voltage with an output of an integrated circuit device;

discharging the timing capacitor with a predetermined current value;

comparing the discharging timing capacitor voltage with a reference voltage within a certain time period;

outputting a first logic level when the discharging timing capacitor voltage is greater than the reference voltage, and outputting a second logic level when the discharging timing capacitor voltage is less than or equal to the reference voltage within the certain time period.

33. A method of determining temperature with a low-voltage detection circuit, said method comprising:

determining a trip voltage value with an integrated circuit voltage comparator; and calculating a temperature from a know temperature by determining a difference between the trip voltage value and a known voltage value, then dividing the difference by a constant.

34. The method of claim 33, wherein the known voltage value, the know temperature and the constant are stored in a memory.

35. A method of determining temperature with a low-current source, said method comprising:

determining a current value of a low-current source; and calculating a temperature from a know temperature by determining a difference between the current value and a known current value, then dividing the difference by a constant.

36. The method of claim 35, wherein the known current value, the know temperature and the constant are stored in a memory.

* * * * *